(12) United States Patent
Xue et al.

(10) Patent No.: US 11,521,860 B2
(45) Date of Patent: Dec. 6, 2022

(54) SELECTIVELY ETCHING FOR NANOWIRES

(71) Applicant: Lam Research Corporation, Fremont, CA (US)

(72) Inventors: Jun Xue, Fremont, CA (US); Samantha SiamHwa Tan, Fremont, CA (US); Mohand Brouri, Fremont, CA (US); Yuanhui Li, Fremont, CA (US); Daniel Peter, Mountain View, CA (US); Alexander Kabansky, Santa Clara, CA (US)

(73) Assignee: Lam Research Corporation, Fremont, CA (US)

( * ) Notice: Subject to any disclaimer, the term of this patent is extended or adjusted under 35 U.S.C. 154(b) by 13 days.

(21) Appl. No.: 17/280,065

(22) PCT Filed: Sep. 26, 2019

(86) PCT No.: PCT/US2019/053245
§ 371 (c)(1),
(2) Date: Mar. 25, 2021

(87) PCT Pub. No.: WO2020/072277
PCT Pub. Date: Apr. 9, 2020

(65) Prior Publication Data
US 2021/0335626 A1    Oct. 28, 2021

Related U.S. Application Data

(60) Provisional application No. 62/740,806, filed on Oct. 3, 2018.

(51) Int. Cl.
*H01L 21/3065* (2006.01)
*H01L 21/3213* (2006.01)
(Continued)

(52) U.S. Cl.
CPC .. *H01L 21/32137* (2013.01); *H01L 21/02532* (2013.01); *H01L 21/02603* (2013.01); *H01L 21/02614* (2013.01); *H01L 29/66439* (2013.01)

(58) Field of Classification Search
CPC ............. H01L 21/31116; H01L 21/3065
See application file for complete search history.

(56) References Cited

U.S. PATENT DOCUMENTS

| 9,236,265 B2 | 1/2016 | Korolik et al. |
| 2014/0308816 A1 | 10/2014 | Wang et al. |

(Continued)

FOREIGN PATENT DOCUMENTS

| KR | 10-0578130 | 5/2006 |
| WO | 2018-140493 | 8/2018 |
| WO | 2020/018366 | 1/2020 |

OTHER PUBLICATIONS

International Search Report from International Application No. PCT/US2019/053245 dated Jan. 13, 2020.
(Continued)

*Primary Examiner* — Thomas T Pham
(74) *Attorney, Agent, or Firm* — Beyer Law Group LLP

(57) ABSTRACT

A method for selectively etching layers of a first material with respect to layers of a second material in a stack is provided. The layers of the first material are partially etched with respect to the layers of the second material. A deposition layer is selectively deposited on the stack, wherein portions of the deposition layer covering the layers of the second material are thicker than portions covering the layers of the first material, the selective depositing comprising providing a first reactant, purging some of the first reactant, wherein some undeposited first reactant is not purged, and providing a second reactant, wherein the undeposited first reactant combines with the second reactant and selectively deposits on the layers of the second material with respect to (Continued)

the layers of the first material. The layers of the first material are selectively etched with respect to the layers of the second material.

18 Claims, 7 Drawing Sheets

(51) Int. Cl.
*H01L 21/02* (2006.01)
*H01L 29/66* (2006.01)

(56) References Cited

U.S. PATENT DOCUMENTS

2015/0126040 A1   5/2015   Korolik et al.
2017/0271165 A1   9/2017   Kal et al.
2018/0175163 A1*  6/2018   Barraud ............ H01L 29/78696
2021/0222303 A1*  7/2021   Zhu ........................... C23F 1/16

OTHER PUBLICATIONS

Written Opinion from International Application No. PCT/US2019/053245 dated Jan. 13, 2020.

\* cited by examiner

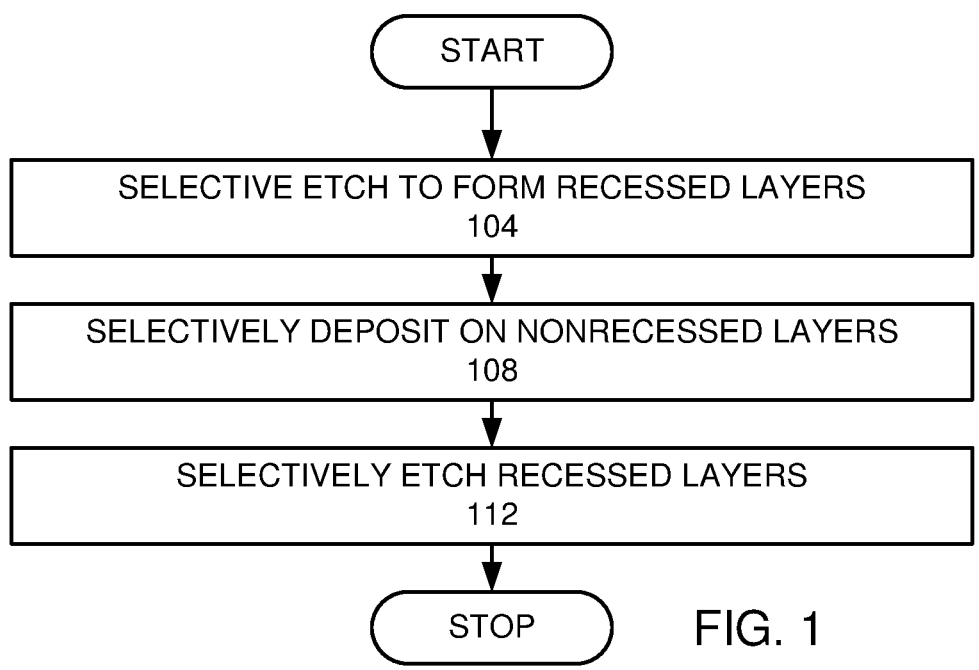

US 11,521,860 B2

SELECTIVELY ETCHING FOR NANOWIRES

CROSS-REFERENCE TO RELATED APPLICATION

This application claims the benefit of priority of U.S. Application No. 62/740,806, filed Oct. 3, 2018, which is incorporated herein by reference for all purposes.

BACKGROUND

The disclosure relates to methods of forming semiconductor devices on a semiconductor wafer. More specifically, the disclosure relates to the selective etching of nanowires.

In forming semiconductor devices, nanowires may be formed by selectively etching silicon germanium (SiGe) with respect to silicon (Si). Nanowires may also be formed by selectively etching Si with respect to SiGe.

SUMMARY

To achieve the foregoing and in accordance with the purpose of the present disclosure, a method for selectively etching layers of a first material with respect to layers of a second material in a stack, wherein layers of the first material alternate with layers of the second material is provided. The layers of the first material are partially etched with respect to the layers of the second material. A deposition layer is selectively deposited on the stack, wherein portions of the deposition layer covering the layers of the second material are thicker than portions of the deposition layer covering the layers of the first material, the selective depositing comprising providing a first reactant, wherein some of the first reactant deposits on the stack, purging some of the first reactant, wherein some undeposited first reactant is not purged, and providing a second reactant, wherein the undeposited first reactant combines with the second reactant, wherein the combined undeposited first reactant and second reactant selectively deposits on the layers of the second material with respect to the layers of the first material, and wherein some of the second reactant reacts with the deposited first reactant to form part of the deposition layer. The layers of the first material are selectively etched with respect to the layers of the second material to completely remove the layers of the first material, wherein the layers of the second material are protected by the deposition layer.

In another manifestation, a method for selectively etching silicon germanium with respect to silicon in a stack wherein at least one layer of silicon germanium is between two layers of silicon is provided. The silicon germanium is partially etched with respect to silicon. The stack is coated with a selective deposition process, wherein the selective deposition process deposits more on silicon than silicon germanium. The selective deposition process comprises providing a silicon precursor, wherein some of the silicon precursor deposits on the stack, purging some of the silicon precursor, wherein some undeposited silicon precursor remains, providing an oxidizing gas, wherein the undeposited silicon precursor combines with the oxidizing gas to form undeposited silicon oxide, wherein the undeposited silicon oxide nonconformally and preferentially deposits on silicon with respect to the silicon germanium, and wherein some of the oxidizing gas oxidizes the deposited silicon precursor to transform the deposited silicon precursor into silicon oxide. The silicon germanium is selectively etched with respect to the silicon oxide to completely remove the silicon germanium.

In another manifestation, a method for selectively etching silicon with respect to silicon germanium in a stack, wherein at least one layer of silicon is between two layers of silicon germanium is provided. The silicon is partially etched with respect to the silicon germanium. The stack is coated with a selective deposition process, wherein the selective deposition process deposits more on silicon germanium than silicon. The selective deposition process comprises providing a silicon precursor, wherein some of the silicon precursor deposits on the stack, purging some of the silicon precursor, wherein some undeposited silicon precursor remains, providing an oxidizing gas, wherein the undeposited silicon precursor combines with the oxidizing gas to form undeposited silicon oxide, wherein the undeposited silicon oxide nonconformally and preferentially deposits on the silicon germanium with respect to the silicon, and wherein some of the oxidizing gas oxidizes the deposited silicon precursor to transform the deposited silicon precursor into silicon oxide. The silicon is selectively etched with respect to the silicon oxide to completely remove the silicon.

These and other features of the present disclosure will be described in more details below in the detailed description and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which:

FIG. 1 is a high level flow chart of an embodiment.

DETAILED DESCRIPTION OF THE EXEMPLARY EMBODIMENTS

The present disclosure will now be described in detail with reference to a few exemplary embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well known process steps and/or structures have not been described in detail in order to not unnecessarily obscure the present disclosure.

Figure 2A:
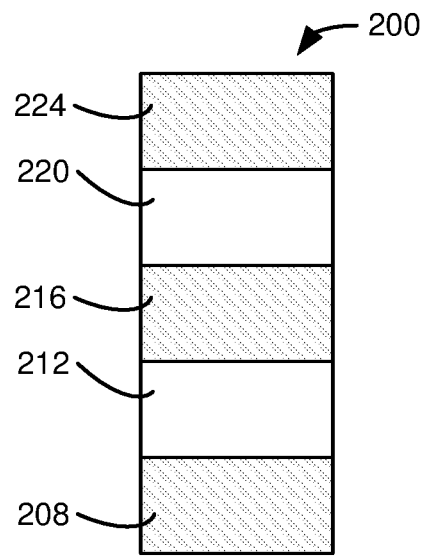
FIGS. 2A-D are schematic cross-sectional views of a stack processed according to an embodiment.

FIG. 1 is a high level flow chart of an embodiment. In this embodiment, a stack of alternating layers of a first material and a second material is selectively etched to form recessed layers of the first material (step 104). In this example, the first material is SiGe and the second material is Si. FIG. 2A is a schematic cross-sectional view of part of a stack 200 on a wafer. In this embodiment, the stack 200 comprises a first Si layer 208 adjacent to a first SiGe layer 212 on a first side of the first SiGe layer 212. The first SiGe layer 212 is adjacent to a second Si layer 216 on a second side of the first SiGe layer 212. The first Si layer 208 and the second Si layer 216 are on opposite sides of the first SiGe layer 212. A second SiGe layer 220 is adjacent to the second Si layer 216. The second Si layer 216 is on a first side of the second SiGe layer 220. The first SiGe layer 212 and the second SiGe layer 220 are on opposite sides of the second Si layer 216. The second SiGe layer 220 is adjacent to a third Si layer 224 on a second side of the second SiGe layer 220. The second Si layer 216 and the third Si layer 224 are on opposite sides of the second SiGe layer 220.

The Si layers 208, 216, 224 and SiGe layers 212, 220 may extend between and be connected to electrical contacts or other structures (not shown). If the SiGe layers 212, 220 are selectively etched away, then the Si layers 208, 216, 224 remain extending between the electrical contacts and may be used as nanowires. Similarly, if the Si layers 208, 216, 224 are selectively etched away, then the SiGe layers 212, 220 remain extending between the electrical contacts and may be used as nanowires. The dimensions of the Si layers 208, 216, 224 and SiGe layers 212, 220 are so small that the etch should be highly selective. The Si layers 208, 216, 224 and SiGe layers 212, 220 may be horizontal layers or vertical layers or provide layers that are at other angles.

Figure 3:
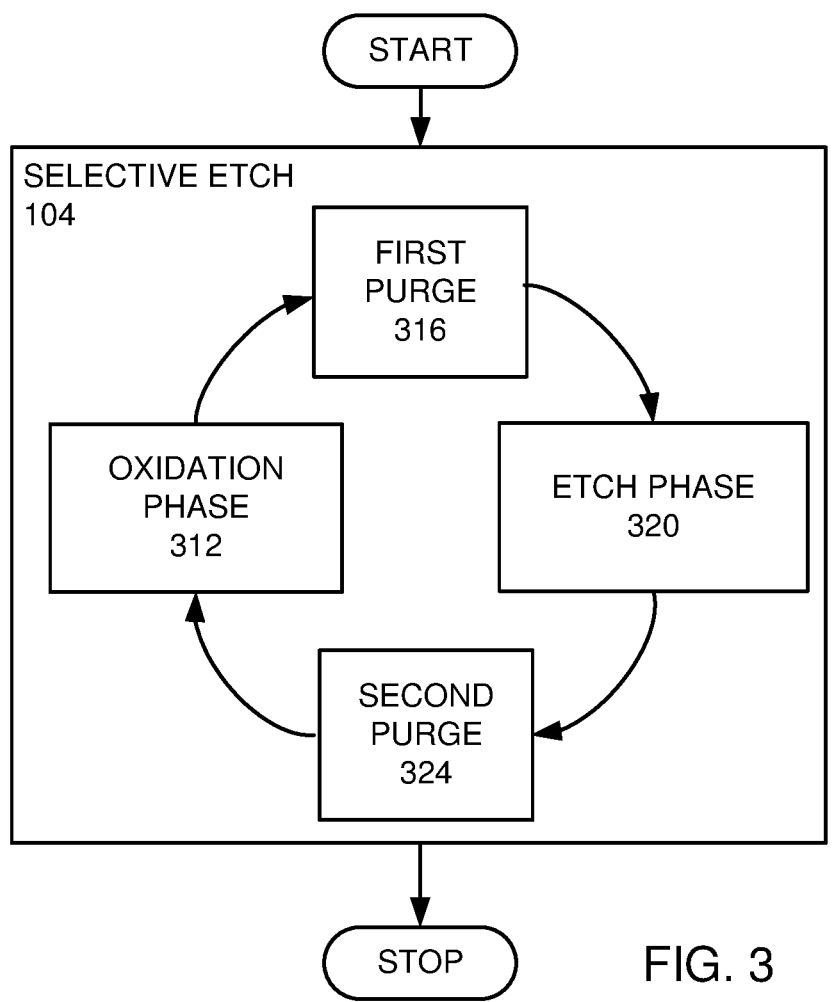
FIG. 3 is a more detailed flow chart of a selective etch process.

In an exemplary embodiment, the stack is partially selectively etched to form recessed layers (step 104). In this embodiment, the first SiGe layer 212 and the second SiGe layer 220 are partially selectively etched with respect to the first Si layer 208, the second Si layer 216, and the third Si layer 224. In this example, the etch is an atomic layer etch (ALE) using a cyclic etch process. FIG. 3 is a more detailed flow chart of the selective partial etch to form recessed layers (step 104) using an ALE. The ALE is shown as at least one cycle. Each cycle of the ALE process comprises an oxidation phase (step 312), a first purge (step 316), an etch phase (step 320), and a second purge (step 324).

In an example, during the oxidation phase (step 312), the stack 200 is exposed to an oxidation gas, such as $O_2$, for about 2 seconds. The oxidization causes an outer surface of the first Si layer 208, the second Si layer 216, and the third Si layer 224 to oxidize forming a silicon oxide ($SiO_2$) layer on the surfaces of the first Si layer 208, the second Si layer 216, and the third Si layer 224. The oxidation gas is purged during the first purge (step 316). A purge gas, such as nitrogen ($N_2$) may be used to purge the oxidation gas. During the etch phase (step 320), the stack 200 is exposed to an etch gas, such as carbon tetrafluoride ($CF_4$). The $CF_4$ selectively etches SiGe with respect to $SiO_2$. A second purge (step 324) provides a purge gas to purge the etch gas. In this example, the purge gas is $N_2$. In this example, the ALE process is performed for 7-10 cycles.

Figure 2B:
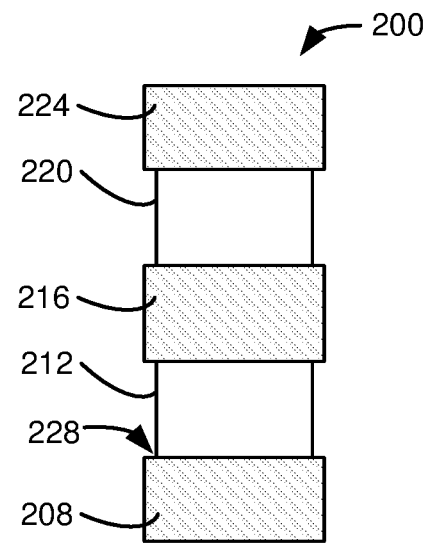

FIG. 2B is a cross-sectional view of the stack 200 after the first SiGe layer 212 and the second SiGe layer 220 are partially selectively etched with respect to the first Si layer 208, the second Si layer 216, and the third Si layer 224. All of the layers are etched. However, the first and second SiGe layers 212, 220 are etched more than the first, second, and third Si layers 208, 216, 224. In this example, the ratio of the etching of the first and second SiGe layers 212, 220 with respect to the first, second, and third Si layers 208, 216. 224 is about 9:1. The etching of the layers is not drawn to scale. This creates a dip 228 or recess transitioning from the first Si layer 208 to the first SiGe layer 212.

Figure 4:
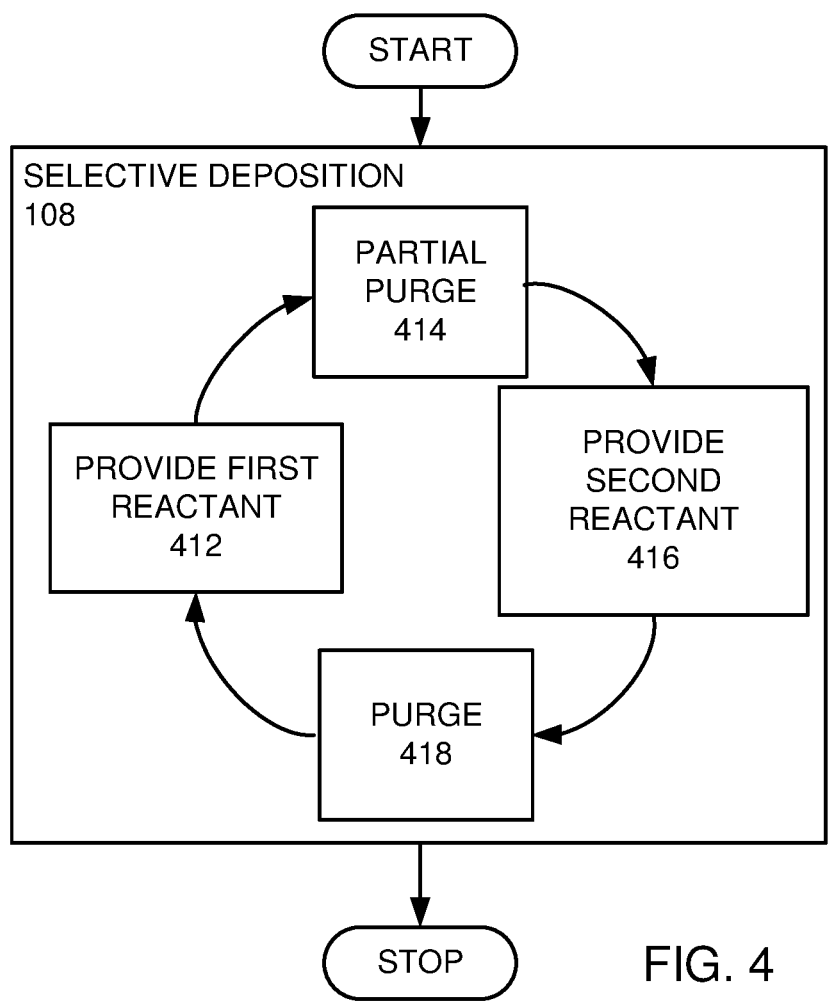
FIG. 4 is a more detailed flow chart of a selective deposition process.

A layer is selectively deposited on nonrecessed layers of the stack 200 (step 108). FIG. 4 is a more detailed flow chart of the selective deposition process (step 108). The selective deposition process (step 108) comprises at least one cycle of providing a first reactant (step 412), providing a partial purge (step 414), providing a second reactant (step 416), and providing a second purge (step 418).

The first reactant is provided to the stack 200 (step 412). In this embodiment, the first reactant is a liquid silicon containing precursor. The precursor is vaporized and delivered in vapor form to the stack 200. The vapor doses the stack 200 to saturation, forming a layer of precursor over the stack 200. In this example, the precursor has a composition of the general type $C(x)H(y)N(z)O(a)Si(b)$. In some embodiments, the precursor has one of the following compositions: N,N,N',N',N'',N''-Hexamethylsilanetriamine ($C_6H_{19}N_3Si$, $C_8H_{22}N_2Si$), (3-Aminopropyl)triethoxysilane ($C_9H_{23}NO_3Si$), and Tetra(isopropoxy)silane ($C_{12}H_{28}O_4Si$). In this example, the precursor comprises Bis(tert-butylamino) silane ($C_8H_{22}N_2Si$)(BTBAS). In this example, the providing of the precursor is plasmaless. The precursor has a silicon function group. The silicon function group forms a monolayer on the stack 200, since the precursor does not attach to another precursor.

Once the stack 200 is dosed with the precursor, the delivery of the precursor vapor is stopped. Then a partial purge step is provided (step 414) to purge out some of the undeposited precursors that linger in a process chamber. $N_2$ may be used as the purge gas for the partial purge (step 414). Some of the undeposited precursors may remain in the process chamber.

A second reactant is provided (step 416). In this embodiment, the providing the second reactant comprises providing a second reactant gas comprising 1000 sccm to 2000 sccm oxygen ($O_2$) to the process chamber. In this example, the second reactant is an oxidizing gas. In this example, a power of 500 to 3000 watts is delivered at 13.56 MHz to form the second reactant gas into a plasma. A pressure of 20 mTorr to 100 mTorr is provided. Some of the second reactant gas combines with the undeposited first reactant. In this example, the oxidizing gas and the undeposited silicon precursor form undeposited silicon oxide ($SiO_2$). The undeposited silicon oxide selectively deposits on the stack 200 to provide a nonconformal deposition. In addition, the oxidizing gas oxidizes the deposited silicon precursor, forming a conformal atomic layer deposition (ALD) layer on the stack 200. After the deposition is completed, the process chamber is purged (step 418). $N_2$ may be used as the purge gas. The cycle may then be repeated. In this example, the cycle is repeated from 3 to 15 times.

Figure 2C:
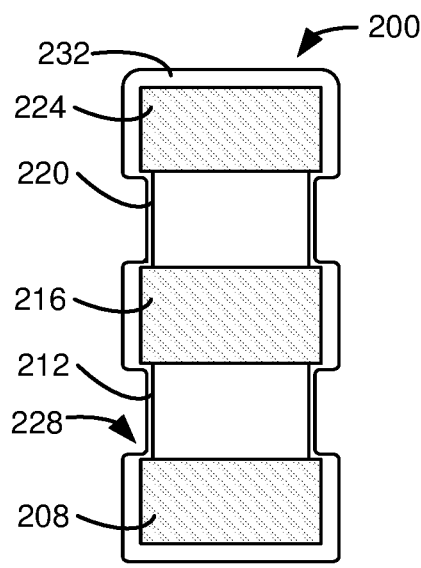

FIG. 2C is a cross-sectional view of the stack 200 after a selective deposition layer 232 has been deposited (step 108). The selective deposition layer 232 forms a thicker layer over the first, second, and third Si layers 208, 216, 224 than over the first and second SiGe layers 212, 220. The deposition layer 232 forms a coating over the stack 200. Without being bound by theory, it is believed that the selective deposition process (step 108) deposits less on recessed regions. One reason may be that the selective deposition process (step 108) deposits less on the recessed layers due to curvature created by the dip 228. The thickness of the selective deposition layer 232 is not drawn to scale, but is enlarged for better clarity and illustration.

Referring back to FIG. 1, the recessed layers are selectively etched (step 112). In this embodiment, an atomic layer etch process is used to selectively etch the first SiGe layer 212 and the second SiGe layer 220 with respect to the first Si layer 208, the second Si layer 216, and the third Si layer 224. The atomic layer etch process recipe used for partially selectively etching the stack 200 to form recessed layers (step 104) may be used for selectively etching the recessed layers (step 112). In this example, the selective deposition layer 232 covering the Si layers 208, 216, 224 is thick enough so that these layers 208, 216, 224 are protected from the selective etching before the first and second SiGe layers 212, 220 are completely etched away.

Figure 2D:
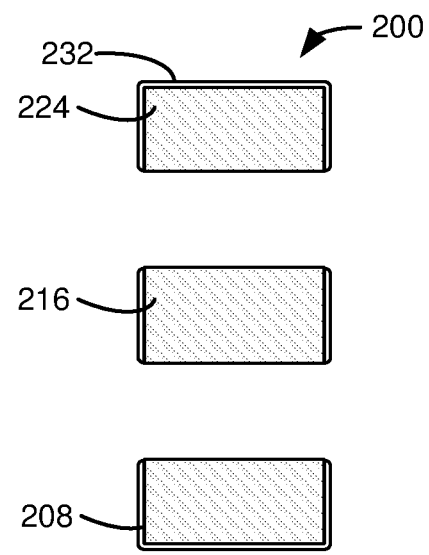

FIG. 2D is a cross-sectional view of the stack 200 after the first and second

SiGe layers 212, 220 are completely etched away. The resulting Si layers 208, 216, 224 may be used as horizontal nanowires for n-type metal-oxide-semiconductor (NMOS) devices. In such devices, the Si layers 208, 216, 224 may be suspended between the electrical contact structures. This embodiment provides an etch selectivity greater than 20:1 for etching SiGe with respect to Si. In addition, less than 5 Å of Si is lost due to oxidation or etching during the process. This embodiment selectively etches SiGe with respect to silicon oxide ($SiO_2$) and silicon nitride (SiN) with a selectivity of greater than 100:1.

In various embodiments the etch gas comprises a fluorine containing component. In various embodiments, the fluorine containing component is a fluorocarbon, such as $CF_4$, hexafluoro-2-butyne ($C_4F_6$), octafluorocyclobutane ($C_4F_8$), or hydrofluorocarbon, such as fluoroform ($CHF_3$) or difluoromethane ($CH_2F_2$). In various embodiments, the etch gas has a total flow per etch gas molecule. The fluorine containing gas comprises fluorine, wherein the fluorine has a fluorine flow per fluorine atom. A ratio of the total flow of the etch gas per etch gas molecule to the fluorine flow per fluorine atom is between 1000:1 to 5:1. For example, in the above embodiment, the etch gas was 45 sccm $CF_4$, 1000 sccm Ar, and 1000 sccm He. In this example, since there are 4 fluorine atoms in $CF_4$ the flow rate of fluorine atoms is 180 sccm. The total flow rate of all molecules of the etch gas is 2045 sccm. Therefore, the ratio of the total flow rate of the etch gas to the flow rate of fluorine atoms is 2045:180, which is about 11:1. In order to lower the percentage of fluorine atoms compared to the total etch gas flow, one or more inert gases such as noble gases are added to the etch gas.

In some embodiments, the selective deposition layer 232 is completely removed. A protection layer may be deposited around the resulting Si layers 208, 216, 224. In an embodiment, the protection layer may be formed by an atomic layer deposition process that deposits a silicon containing layer. Examples of such a silicon containing layer may be a silicon oxide or silicon nitride layer. The protective layer prevents the resulting Si layers 208, 216, 224 from oxidizing. The oxidation of the resulting Si layers 208, 216, 224 would further diminish the silicon layers. As a result, the etch would be even less selective.

Figure 5A:
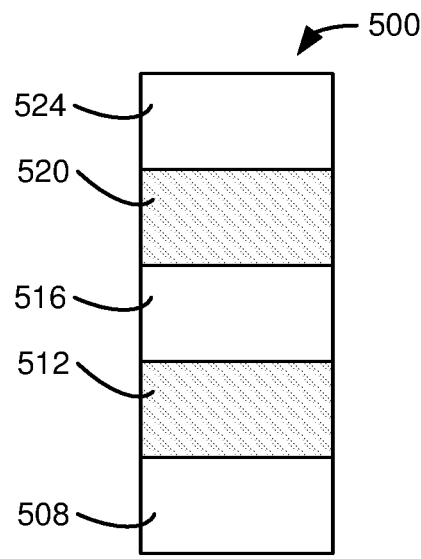
FIGS. 5A-D are schematic cross-sectional views of a stack processed according to another embodiment.

In another embodiment, a Si layer is selectively etched with respect to SiGe layers. The first material is Si and the second material is SiGe. FIG. 5A is a schematic cross-sectional view of part of a stack 500 on a wafer. In this embodiment, the stack 500 comprises a first SiGe layer 508 adjacent to a first Si layer 512 on a first side of the first Si layer 512. The first Si layer 512 is adjacent to a second SiGe layer 516 on a second side of the first Si layer 512. The first SiGe layer 508 and the second SiGe layer 516 are on opposite sides of the first Si layer 512. A second Si layer 520 is adjacent to the second SiGe layer 516. The second SiGe layer 516 is on a first side of the second Si layer 520. The first Si layer 512 and the second Si layer 520 are on opposite sides of the second SiGe layer 516. The second Si layer 520 is adjacent to a third SiGe layer 524 on a second side of the second Si layer 520. The second SiGe layer 516 and the third SiGe layer 524 are on opposite sides of the second Si layer 520. The SiGe layers 508, 516, 524 and Si layers 512, 520 may extend between and be connected to electrical contacts or other structures (not shown).

In an exemplary embodiment, the stack 500 is partially selectively etched to form recessed layers (step 104). In this embodiment, the first Si layer 512 and the second Si layer 520 are partially selectively etched with respect to the first SiGe layer 508, the second SiGe layer 516, and the third SiGe layer 524. An example recipe for such a selective etch comprises providing an etch gas comprising 10 sccm $CF_4$, 100 sccm hydrogen ($H_2$), 1000 sccm Ar, and 1000 sccm He. A small flow of sulfur hexafluoride ($SF_6$) or hydrogen sulfide ($H_2S$) (0-100 sccm) may be added to improve selectivity. The etch gas is transformed into a plasma. The plasma selectively etches Si with respect to SiGe.

Figure 5B:
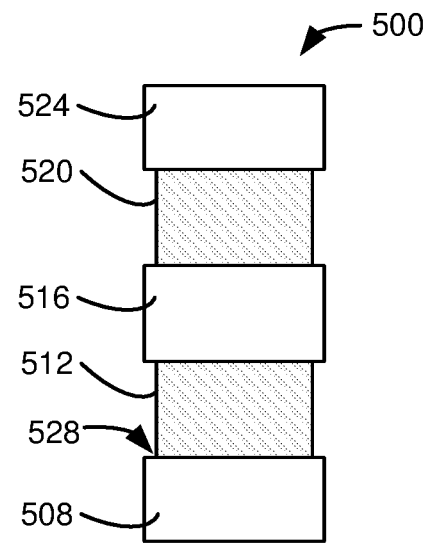

FIG. 5B is a cross-sectional view of the stack 500 after the first Si layer 512 and the second Si layer 520 are partially selectively etched with respect to the first SiGe layer 508, the second SiGe layer 516, and the third SiGe layer 524. All of the layers are etched. However, the first and second Si layers 512, 520 are etched more than the first, second, and third SiGe layers 508, 516, 524. This creates a dip 528 or recess transitioning from the first SiGe layer 508 to the first Si layer 512.

A layer is selectively deposited on nonrecessed layers of the stack (step 108). FIG. 4 is a more detailed flow chart of the selective deposition process (step 108). The selective deposition process (step 108) comprises at least one cycle of providing a first reactant (step 412), providing a partial purge (step 414), providing a second reactant (step 416), and providing a second purge (step 418).

The first reactant is provided to the stack 500 (step 412). In this embodiment, the first reactant is a liquid silicon containing precursor. The liquid silicon containing precursor is vaporized and delivered in vapor form to the stack 500.

The liquid silicon containing precursor doses the stack 500 to saturation, forming a layer of precursor over the stack 500. In this example, the precursor comprises Bis(tert-butylamino) silane ($C_8H_{22}N_2Si$)(BTBAS). In this example, the providing of the precursor is plasmaless. In this embodiment, the first reactant is a silicon precursor. The precursor has a silicon function group. The silicon function group forms a monolayer on the stack 500 since the precursor does not attach to another precursor.

Once the stack 500 is dosed with the precursor, the delivery of the precursor vapor is stopped. Then a partial purge step is provided (step 414) to purge out some of the undeposited precursors that linger in the process chamber. Some of the undeposited precursors may remain in the process chamber.

A second reactant is provided (step 416). In this embodiment, the providing the second reactant comprises providing a second reactant gas comprising 1000 sccm to 2000 sccm oxygen ($O_2$) to the process chamber. In this example, the second reactant is an oxidizing gas. In this example, a power of 500 to 3000 watts is delivered at 13.56 MHz to form the second reactant gas into a plasma. A pressure of 20 mTorr to 100 mTorr is provided. Some of the second reactant gas combines with the undeposited first reactant. In this example, the oxidizer gas and the undeposited silicon precursor form undeposited silicon oxide. The undeposited silicon oxide selectively deposits on the stack 500 to provide a nonconformal deposition. In addition, the oxidizer gas oxidizes the deposited silicon precursor, forming a conformal ALD layer on the stack 500. After the deposition process is completed, the process chamber is purged (step 418). The cycle may then be repeated. In this example, the cycle is repeated from 3 to 12 times.

Figure 5C:
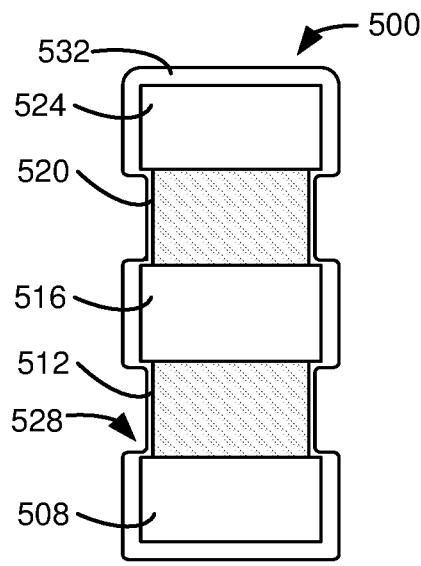

FIG. 5C is a cross-sectional view of the stack 500 after a selective deposition layer 532 has been deposited. The selective deposition layer 532 forms a thicker layer over the first, second, and third SiGe layers 508, 516, 524 than over the first and second Si layers 512, 520. The thickness of the selective deposition layer 532 is not drawn to scale but is enlarged for better clarity and illustration.

Referring back to FIG. 1, the recessed layers are selectively etched (step 112). In this embodiment, the first Si layer 512 and the second Si layer 520 are selectively etched with respect to the first SiGe layer 508, the second SiGe layer 516, and the third SiGe layer 524. An example recipe for such a selective etch comprises providing an etch gas comprising 10 sccm $CF_4$, 100 sccm $H_2$, 1000 sccm Ar, and 1000 sccm He. A small flow of sulfur hexafluoride ($SF_6$) or hydrogen sulfide ($H_2S$) (0-100 sccm) may be added to improve selectivity. The etch gas is transformed into a plasma. The plasma selectively etches Si with respect to SiGe. In this example, the selective deposition layer 532 covering the SiGe layers 508, 516, 524 is not thick enough so that these layers 508, 516, 524 are protected from the selective etching before the first and second Si layers 512, 520 are completely etched away. As a result, in this example another selective deposition process is provided (step 108) and then the first and second Si layers 512, 520 are completely etched away (step 112).

Figure 5D:
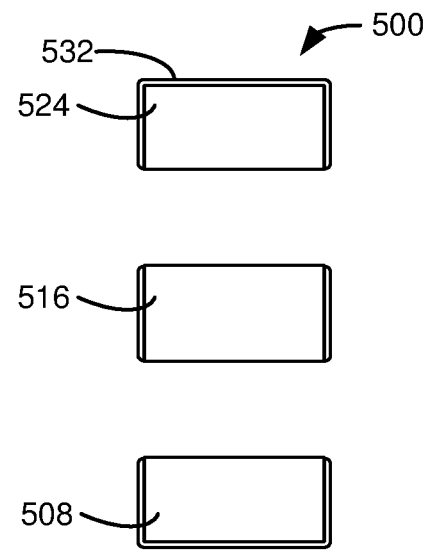

FIG. 5D is a cross-sectional view of the stack 500 after the first and second Si layers 512, 520 are completely etched away. The resulting SiGe layers 508, 516, 524 may be used as horizontal nanowires for p-type metal-oxide-semiconductor (PMOS) devices. This embodiment provides an etch selectivity greater than 20:1 for etching Si with respect to SiGe. In addition, less than 5 Å of SiGe is lost due to oxidation or etching during the process. This embodiment selectively etches Si with respect to silicon oxide ($SiO_2$) and silicon nitride (SiN) with a selectivity of greater than 100:1.

In another embodiment for selectively etching Si with respect to SiGe, an etch gas comprising $SF_6$ and $H_2$ may be used. The fluorine from $SF_6$ may be tied up by the hydrogen as hydrogen fluoride (HF), and SF may be used to passivate Ge in the form of Ge—F, which can help to further passivate SiGe wire. In other embodiments, the etch gas may comprise fluorocarbons, $SF_6$, and $H_2S$ or sulfur-containing gases with $H_2$. In some embodiments, with $CF_4$ and $H_2$, a $CF_4$ to $H_2$ ratio is between 1:1-1: 500.

Figure 6:
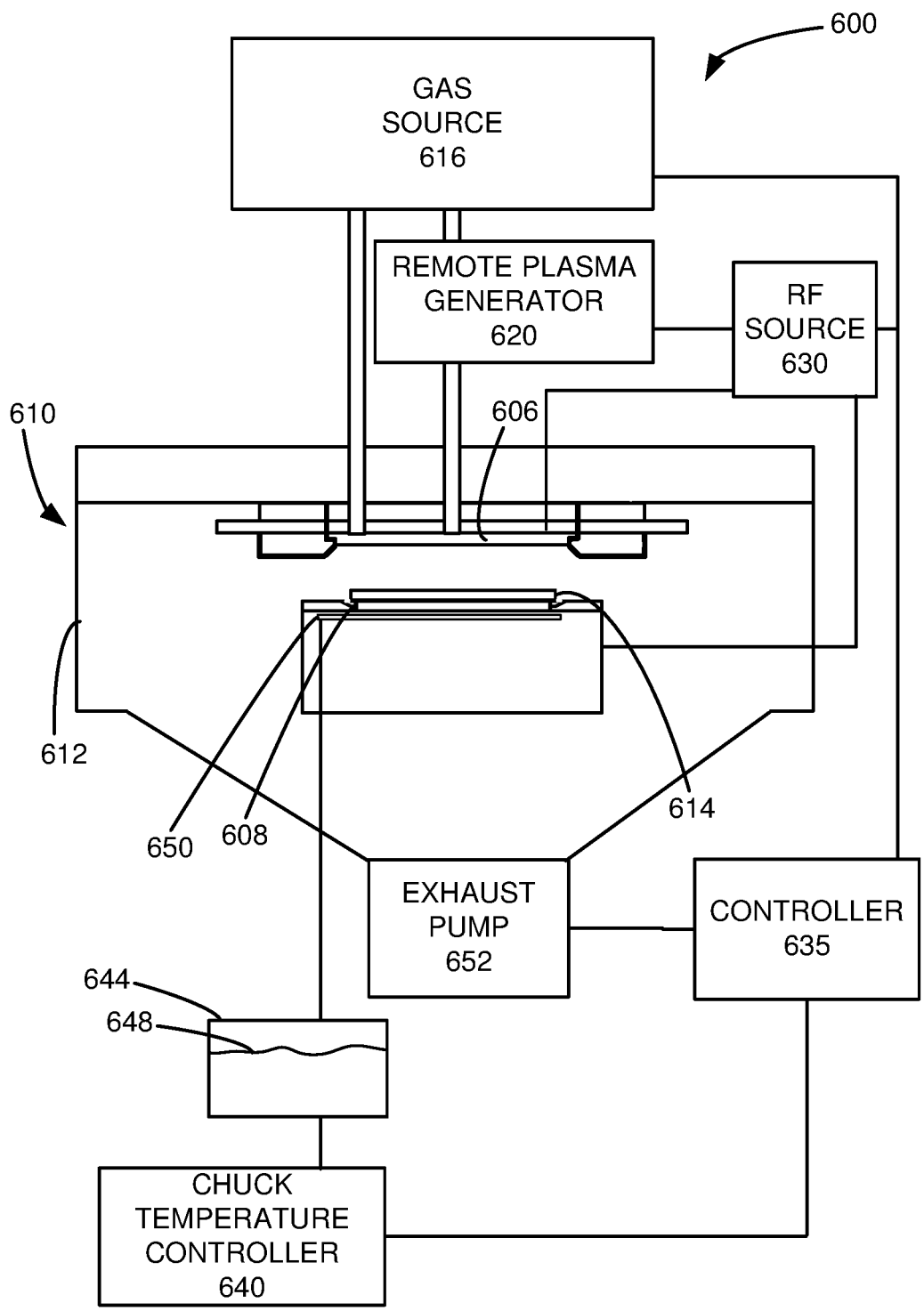
FIG. 6 is a schematic view of a process chamber that may be used in an embodiment.

FIG. 6 is a schematic view of a process chamber 600 which may be used in an embodiment. In one or more embodiments, the process chamber 600 comprises a showerhead 606 providing a gas inlet and an electrostatic chuck (ESC) 608, within a reactor chamber 610, enclosed by a chamber wall 612. Within the reactor chamber 610, a wafer 614 is positioned over the electrostatic chuck 608. A gas source 616 is connected to a remote plasma generator 620. The remote plasma generator 620 is connected to the reactor chamber 610 through the showerhead 606. A radio frequency (RF) source 630 provides RF power at one or more frequencies of 27 megahertz (MHz), 13.56 MHz, 60 MHz, 2 MHz, or 400 kHz to the remote plasma generator 620, an upper electrode provided by the showerhead 606, or a lower electrode, provided by the ESC 608. The RF source 630 may provide power to coils. The RF power is used to create an inductively coupled plasma. A chuck temperature controller 640 controls a chiller 644. The chiller 644 cools a coolant 648. The coolant 648 is provided to a chuck cooling system 650. A controller 635 is controllably connected to the RF source 630, an exhaust pump 652, the chuck temperature controller 640, and the gas source 616.

Figure 7:
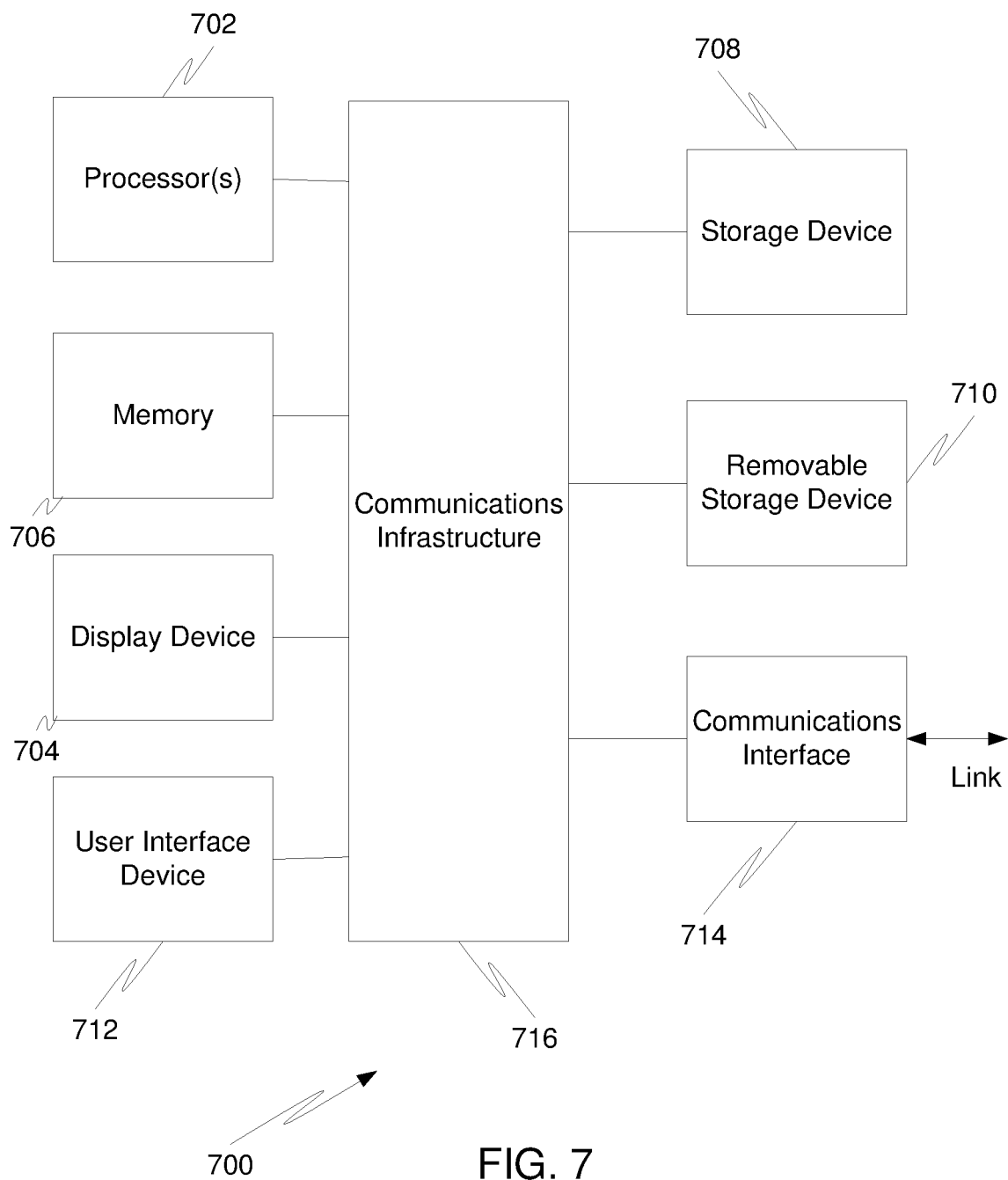
FIG. 7 is a schematic view of a computer system that may be used in practicing an embodiment.

FIG. 7 is a high level block diagram showing a computer system 700, which is suitable for implementing a controller 635 used in embodiments. The computer system 700 may have many physical forms ranging from an integrated circuit, a printed circuit board, and a small handheld device up to a huge supercomputer. The computer system 700 includes one or more processors 702, and further can include an electronic display device 704 (for displaying graphics, text, and other data), a main memory 706 (e.g., random access memory (RAM)), storage device 708 (e.g., hard disk drive), removable storage device 710 (e.g., optical disk drive), user interface devices 712 (e.g., keyboards, touch screens, keypads, mice or other pointing devices, etc.), and a communications interface 714 (e.g., wireless network interface). The communications interface 714 allows software and data to be transferred between the computer system 700 and external devices via a link. The system may also include a communications infrastructure 716 (e.g., a communications bus, cross-over bar, or network) to which the aforementioned devices/modules are connected.

Information transferred via communications interface 714 may be in the form of signals such as electronic, electromagnetic, optical, or other signals capable of being received by communications interface 714, via a communications link that carries signals and may be implemented using wire or cable, fiber optics, a phone line, a cellular phone link, a radio frequency link, and/or other communications channels. With such a communications interface 714, it is contemplated that the one or more processors 702 might receive information from a network, or might output information to the network in the course of performing the above-described method steps. Furthermore, method embodiments may execute solely upon the processors or may execute over a network such as the Internet, in conjunction with remote processors that share a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher-level code that are executed by a computer using an interpreter. Computer readable media may also be computer code transmitted by a computer data signal a processor.

While this disclosure has been described in terms of several exemplary embodiments, there are alterations, modifications, permutations, and various substitute equivalents, which fall within the scope of this disclosure. It should also be noted that there are many alternative ways of implementing the methods and apparatuses of the present disclosure. It is therefore intended that the following appended claims be interpreted as including all such alterations, modifications, permutations, and various substitute equivalents as fall within the true spirit and scope of the present disclosure.

What is claimed is:

1. A method for selectively etching layers of a first material with respect to layers of a second material in a stack, wherein layers of the first material alternate with layers of the second material, comprising:
    partially etching the layers of the first material with respect to the layers of the second material;
    selectively depositing a deposition layer on the stack, wherein portions of the deposition layer covering the layers of the second material are thicker than portions of the deposition layer covering the layers of the first material, the selectively depositing comprising:
  providing a first reactant, wherein some of the first reactant deposits on the stack;
  purging some of the first reactant, wherein some undeposited first reactant is not purged; and
  providing a second reactant, wherein the undeposited first reactant combines with the second reactant, wherein the combined undeposited first reactant and second reactant selectively deposits on the layers of the second material with respect to the layers of the first material, and wherein some of the second reactant reacts with the deposited first reactant to form part of the deposition layer; and
selectively etching the layers of the first material with respect to the layers of the second material to completely remove the layers of the first material, wherein the layers of the second material are protected by the deposition layer.

2. The method, as recited in 1, wherein the undeposited first reactant combined with the second reactant selectively deposits on the layers of the second material with respect to the layers of the first material to provide the deposition layer that is nonconformal.

3. The method, as recited in claim 1, wherein the first material is SiGe and the second material is Si.

4. A method for selectively etching layers of a first material with respect to layers of a second material in a stack, wherein layers of the first material alternate with layers of the second material, wherein the first material is SiGe and the second material is Si, comprising:
  partially etching the layers of the first material with respect to the layers of the second material;
  selectively depositing a deposition layer on the stack, wherein portions of the deposition layer covering the layers of the second material are thicker than portions of the deposition layer covering the layers of the first material, the selectively depositing comprising:
    providing a first reactant, wherein some of the first reactant deposits on the stack:
    purging some of the first reactant, wherein some undeposited first reactant is not purged; and
    providing a second reactant, wherein the undeposited first reactant combines with the second reactant, wherein the combined undeposited first reactant and second reactant selectively deposits on the layers of the second material with respect to the layers of the first material, and wherein some of the second reactant reacts with the deposited first reactant to form part of the deposition layer; and
  selectively etching the layers of the first material with respect to the layers of the second material to completely remove the layers of the first material, wherein the layers of the second material are protected by the deposition layer, wherein the selectively etching the layers of the first material with respect to the layers of the second material comprises providing an atomic layer etch process.

5. The method, as recited in claim 4, wherein the atomic layer etch process comprises a plurality of cycles, wherein each cycle comprises:
  an oxidation phase, wherein the oxidation phase selectively oxidizes the layers of the second material with respect to the layers of the first material; and
  an etch phase with selectively etches the layers of the first material with respect to the oxidized layers of the second material.

6. The method, as recited in claim 1, wherein the selectively etching the layers of the first material with respect to the layers of the second material to completely remove the layers of the first material, comprises:
  selectively etching the layers of the first material with respect to the layers of the second material;
  selectively depositing a deposition layer on the stack, wherein portions of the deposition layer covering the layers of the second material are thicker than portions of the deposition layer covering the layers of the first material; and
  selectively etching the layers of the first material with respect to the layers of the second material.

7. The method, as recited in claim 1, wherein the selectively etching the layers of the first material with respect to the layers of the second material to completely remove the layers of the first material comprises selectively etching the layers of the first material with respect to the layers of the second material without selectively depositing a deposition layer on the stack.

8. A method for selectively etching layers of a first material with respect to layers of a second material in a stack, wherein layers of the first material alternate with layers of the second material, comprising:
  partially etching the layers of the first material with respect to the layers of the second material, wherein the partially etching the layers of the first material with respect to the layers of the second material comprises:
    providing an etch gas; and
    transforming the etch gas into a plasma, wherein the plasma selectively etches the layers of the first material with respect to the layers of the second material to create recessed layers of the first materials;
  selectively depositing a deposition layer on the stack, wherein portions of the deposition layer covering the layers of the second material are thicker than portions of the deposition layer covering the layers of the first material, the selectively depositing comprising:
    providing a first reactant, wherein some of the first reactant deposits on the stack;
    purging some of the first reactant, wherein some undeposited first reactant is not purged; and
    providing a second reactant, wherein the undeposited first reactant combines with the second reactant, wherein the combined undeposited first reactant and second reactant selectively deposits on the layers of the second material with respect to the layers of the first material, and wherein some of the second reactant reacts with the deposited first reactant to form part of the deposition layer; and
  selectively etching the layers of the first material with respect to the layers of the second material to completely remove the layers of the first material, wherein the layers of the second material are protected by the deposition layer.

9. A method for selectively etching layers of a first material with respect to layers of a second material in a stack, wherein layers of the first material alternate with layers of the second material, comprising:
  partially etching the layers of the first material with respect to the layers of the second material, wherein the partially etching the layers comprises providing an atomic layer etch process;
  selectively depositing a deposition layer on the stack, wherein portions of the deposition layer covering the layers of the second material are thicker than portions of the deposition layer covering the layers of the first material, the selectively depositing comprising:
providing a first reactant, wherein some of the first reactant deposits on the stack;
purging some of the first reactant, wherein some undeposited first reactant is not purged; and
providing a second reactant, wherein the undeposited first reactant combines with the second reactant, wherein the combined undeposited first reactant and second reactant selectively deposits on the layers of the second material with respect to the layers of the first material, and wherein some of the second reactant reacts with the deposited first reactant to form part of the deposition layer; and
selectively etching the layers of the first material with respect to the layers of the second material to completely remove the layers of the first material, wherein the layers of the second material are protected by the deposition layer.

10. The method, as recited in claim 9 wherein the atomic layer etch process comprises a plurality of cycles, wherein each cycle comprises:
an oxidation phase, wherein the oxidation phase selectively oxidizes the layers of the second material with respect to the layers of the first material; and
an etch phase, wherein the etch phase selectively etches the layers of the first material with respect to the oxidized layers of the second material.

11. A method for selectively etching layers of a first material with respect to layers of a second material in a stack, wherein layers of the first material alternate with layers of the second material, wherein the first material is Si and the second material is SiGe, comprising:
partially etching the layers of the first material with respect to the layers of the second material;
selectively depositing a deposition layer on the stack, wherein portions of the deposition layer covering the layers of the second material are thicker than portions of the deposition layer covering the layers of the first material, the selectively depositing comprising:
providing a first reactant, wherein some of the first reactant deposits on the stack;
purging some of the first reactant, wherein some undeposited first reactant is not purged; and
providing a second reactant, wherein the undeposited first reactant combines with the second reactant, wherein the combined undeposited first reactant and second reactant selectively deposits on the layers of the second material with respect to the layers of the first material, and wherein some of the second reactant reacts with the deposited first reactant to form part of the deposition layer; and
selectively etching the layers of the first material with respect to the layers of the second material to completely remove the layers of the first material, wherein the layers of the second material are protected by the deposition layer.

12. A method for selectively etching layers of a first material with respect to layers of a second material in a stack, wherein layers of the first material alternate with layers of the second material, comprising:
partially etching the layers of the first material with respect to the layers of the second material;
selectively depositing a deposition layer on the stack, wherein portions of the deposition layer covering the layers of the second material are thicker than portions of the deposition layer covering the layers of the first material, the selectively depositing comprising:
providing a first reactant, wherein some of the first reactant deposits on the stack;
purging some of the first reactant, wherein some undeposited first reactant is not purged; and
providing a second reactant, wherein the undeposited first reactant combines with the second reactant, wherein the combined undeposited first reactant and second reactant selectively deposits on the layers of the second material with respect to the layers of the first material, and wherein some of the second reactant reacts with the deposited first reactant to form part of the deposition layer, wherein the first reactant is a silicon containing precursor and the second reactant is an oxidizing gas, wherein the undeposited first reactant is an undeposited silicon containing precursor, wherein the undeposited silicon containing precursor reacts with the oxidizing gas to form undeposited silicon oxide, wherein the undeposited silicon oxide selectively deposits on the layers of the second material; and
selectively etching the layers of the first material with respect to the layers of the second material to completely remove the layers of the first material, wherein the layers of the second material are protected by the deposition layer.

13. A method for selectively etching silicon germanium with respect to silicon in a stack, wherein at least one layer of silicon germanium is between two layers of silicon, comprising:
partially etching the silicon germanium with respect to silicon;
coating the stack with a selective deposition process, wherein the selective deposition process deposits more on silicon than silicon germanium, the selective deposition process comprising:
providing a silicon precursor, wherein some of the silicon precursor deposits on the stack;
purging some of the silicon precursor, wherein some undeposited silicon precursor remains;
providing an oxidizing gas, wherein the undeposited silicon precursor combines with the oxidizing gas to form undeposited silicon oxide, wherein the undeposited silicon oxide nonconformally and preferentially deposits on silicon with respect to the silicon germanium, and wherein some of the oxidizing gas oxidizes the deposited silicon precursor to transform the deposited silicon precursor into silicon oxide; and
selectively etching silicon germanium with respect to the silicon oxide to completely remove the silicon germanium.

14. The method, as recited in claim 13, wherein the partially etching the silicon germanium with respect to the silicon, comprises:
providing an etch gas; and
transforming the etch gas into a plasma, wherein the plasma selectively etches the layers of the first material with respect to the layers of the second material to create recessed layers of the first material.

15. The method, as recited in claim 13, wherein the partially etching the silicon germanium with respect to the silicon comprises providing an atomic layer etch process, the atomic layer etch process comprising:

an oxidation phase, wherein the oxidation phase selectively oxidizes the silicon forming silicon oxide with respect to the silicon germanium; and an etch phase, wherein the etch phase selectively etches the silicon germanium with respect to the silicon oxide.

16. A method for selectively etching silicon with respect to silicon germanium in a stack, wherein at least one layer of silicon is between two layers of silicon germanium, comprising:

partially etching the silicon with respect to the silicon germanium;

coating the stack with a selective deposition process, wherein the selective deposition process deposits more on silicon germanium than silicon, the selective deposition process comprising:

providing a silicon precursor, wherein some of the silicon precursor deposits on the stack;

purging some of the silicon precursor, wherein some undeposited silicon precursor remains;

providing an oxidizing gas, wherein the undeposited silicon precursor combines with the oxidizing gas to form undeposited silicon oxide, wherein the undeposited silicon oxide nonconformally and preferentially deposits on the silicon germanium with respect to the silicon, and wherein some of the oxidizing gas oxidizes the deposited silicon precursor to transform the deposited silicon precursor into silicon oxide; and selectively etching the silicon with respect to the silicon oxide to completely remove the silicon.

17. The method, as recited in claim 16, wherein the partially etching the silicon with respect to the silicon germanium comprises:

providing an etch gas comprising a fluorocarbon and hydrogen; and transforming the etch gas into a plasma, wherein the plasma selectively etches the silicon with respect to the silicon germanium.

18. The method, as recited in claim 17, wherein the etch gas further comprises a sulfur containing component.

* * * * *